United States Patent [19]

Inoguchi

[11] Patent Number: 4,906,515

[45] Date of Patent: Mar. 6, 1990

[54] MOLDED ARTICLE OF THERMOPLASTIC RESIN AND PROCESS FOR PRODUCING THE SAME

[75] Inventor: Hirokazu Inoguchi, Fukushima, Japan

[73] Assignee: Nitto Boseki Co., Ltd., Fukushima, Japan

[21] Appl. No.: 257,386

[22] Filed: Oct. 13, 1988

[30] Foreign Application Priority Data

Oct. 22, 1987 [JP] Japan .................................. 62-266848

[51] Int. Cl.$^4$ ................................. B32B 9/00
[52] U.S. Cl. ..................................... 428/209; 428/195;
428/323; 428/325; 428/340; 428/412; 428/419;
428/457; 428/458; 428/460; 428/341;
428/473.5; 428/901; 525/57; 525/61; 524/557;
174/256; 361/397
[58] Field of Search ............... 428/195, 209, 901, 219,
428/412, 419, 473.5, 500, 457, 461, 433, 325,
323, 340–341, 458, 460; 361/397; 174/68.5;
525/57, 61; 524/557

[56] References Cited

U.S. PATENT DOCUMENTS

| | | |
|---|---|---|
| 3,218,215 | 11/1965 | Achterhof et al. . |
| 4,400,577 | 8/1983 | Spear ..................................... 357/30 |
| 4,679,122 | 7/1987 | Belke, Jr. et al. .................. 174/68.5 |

FOREIGN PATENT DOCUMENTS

| | | |
|---|---|---|
| 0045421 | 7/1981 | European Pat. Off. . |
| 127239 | 6/1987 | Japan . |
| 1030446 | 5/1966 | United Kingdom . |
| 1065766 | 4/1967 | United Kingdom . |

OTHER PUBLICATIONS

Electronics International 12/15/82, "Injection Molding . . . ", vol. 55 (1982), Dec. No. 25—Engelmaier et al.

Primary Examiner—Ellis P. Robinson
Assistant Examiner—P. J. Ryan
Attorney, Agent, or Firm—Darby & Darby

[57] ABSTRACT

There are disclosed (1) an injection-molded thermoplastic resin article having on a surface thereof a copper foil or a copper foil circuit, wherein the thermoplastic resin comprises one of polycarbonate, polyethersulfone, and polyetherimide and an adhesive layer comprising polyvinyl butyral having a degree of polymerization of up to 1000, polyvinyl formal having a degree of polymerization of up to 1000, or a mixture or both polymers is formed either the copper foil or the copper foil circuit and the molded thermoplastic resin and (2) a process for producing such injection-molded thermoplastic resin articles.

5 Claims, No Drawings

MOLDED ARTICLE OF THERMOPLASTIC RESIN AND PROCESS FOR PRODUCING THE SAME

BACKGROUND OF THE INVENTION

1. Field of the Invention

The present invention relates to metal-clad moldings of thermoplastic resins and to a process for manufacturing the same. Particularly, the invention relates to such thermoplastic resin articles formed by injection molding and to a process comprising injection molding for manufacturing those articles.

2. Description of the Prior Art

It is already well-known that PWBs or substrates are made of thermoplastics, so called high temperature thermoplastic resins, such as polyether-sulfone and polyetherimide, by injection molding. The process currently being promoted to place conductors on such boards or substrates include (1) an electroless plating process, (2) employing electroconductive coating process, (3) a thermal transfer process, and (4) in-mold transfer process (Japanese Patent Application Kokai No. 57-7193). However, each of these process involves problems, which are, for example, the following:

As to the electroless plating process, conductors of 18 to 35 μm in thickness are difficult to form, the process is complicated, e.g. various washing steps are required, and the technology to permit imaging on a three-dimensional shape is not established.

In the case of the electroconductive coating process, the reliability of placed conductors is unsatisfactory, for instance, the resistance of conductive traces is not unifom the circuits on exposure to heat cycles are liable to break, as well as liable to crack upon exposure to heat cycle, and printing on a three dimensional shape is also difficult.

The thermal transfer process has the same problems as electroconductive coating process has, and transferring conductive traces onto three-dimensional substrates is limited in their abilities to produce conductive features.

In addition to these problems, above three process, in common, tend to include many operation steps and hence the production costs go up higher.

On the other hand, in the in-mold process, thermal transfer paper, onto which the conductive traces are printed previously, is set in a mold die.

A plastic molding composition is injected into the mold cavity and comes into contact with and adheres to the conductive trace, at the same time the substrate is injection-molded. Hence, the in-mold process can get rid of many separate steps circuits on a substrate and is quite fitted for mass production. However, in case of high temperature thermoplastic resins, the conductive traces tend to be damaged or poor in adhesion because of the higher resin temperature and the higher injection pressure. Although copper foil circuits, on the other hand, could be formed with ease in this process by conventional etching process and the damage of the circuits themselves thus can be avoided, the adhesive strength of copper foil circuits to molded substrates is very low; hence this process employing copper foils has not been put to practical use.

That is, when copper foil circuits are formed on injection-molded substrates of high-temperature resins such as polyethersulfone and polyetherimide according to the in-mold method by employing thermal transfer films, the copper foil circuits will have little adhesive force to the molded substrates. Therefore, it has been impossible up to now to apply such moldings as printed circuit boards or substrates.

SUMMARY OF THE INVENTION

The primary object of the present invention is to provide high temperature thermoplastic resin substrates overlaid with printed circuits and such substrates overlaid with copper foils for printed circuits (in this specification, such substrates are referred to as "molded thermoplastic resin articles"), thereby solving the above noted problems.

Other objects and advantages of the present invention will be apparent from the following description.

DETAILED DESCRIPTION OF THE INVENTION

The present inventors made extensive studies for the purpose of achieving the above and other objects. As a result, it has been found that the adhesion of copper foils to high-temperature resistant resins substrate can be enhanced by using (i) Selection of polycarbonate, polyethersulfone, or polyetherimide as said substrate, (ii) polyvinyl butyrol or polyvinyl formal of particular degrees of polymerization or a mixture of both resins as an adhesive to bond copper foils to the substrate resin, and (iii) a mold preheated at a temperature at least 100° C. in molding the resin substrate, whereby superior "molded thermoplastic resin articles" can be produced by injection molding using said high-temperature thermoplastic rsins to form the substrates. Based on this finding, the present invention has been accomplished.

Polycarbonates, polyethersulfone, or polyetherimide is suitable for the purpose of providing high temperature resistant substrates, optionally, these resins might contain each a suitable filler selected from various ones according to the applications of the end product. Among such fillers glass fiber preferably could be used.

As stated above, polyvinyl butyral or polyvinyl formal is used as an adhesive to bond the copper foil to the substrate. Desirably, these polymers have degrees of polymerization not exceeding 1000. These polymers have been chosen as adhesives, because they exhibit good adhesive properties to copper foils as well as good compatibility with the above three thermoplastic resins and have thermoplastic properties, hence being fitted for use like hot-melt adhesives. The reason for limiting the maximum degrees of polymerization of polyvinyl butyral and polyvinyl formal to 1000 is that, since molds in the present invention are preheated at temperatures of at least 100° C. for using these polymers like hot-melt adhesives, each polymer, if its degree of polymerization is too high, will exhibit in consequence such high melt viscosity that physical entanglements of this polymer chains with melt-injected substrate polymer chains will be hard to occur at the adherent interface. When the amount of adhesive applied is too small, good adherence will not be obtained since the adhesive is used like a hot melt adhesive. When the amount of adhesive is larger, the apparent fluidity of the adhesive is higher and the adherence between the copper foil and the substrate resin is better. Suitable amounts of adhesive applied are 20 g/m² and more, preferably from 30 to 60 g/m². A gravure coater may be used for applying the adhesive.

A general-purpose phenol, melamine, or urea adhesive is optionally added in a slight amount to the polyvinyl butyral or polyvinyl formal adhesive used in the present invention for the purpose of lowering the stickiness of this adhesive and improving the coating workability thereof. Also a filler such as $TiO_2$ or $CaCO_3$ may be added separately or jointly with said general-purpose adhesive.

Suitable solvents for use to solve the above-mentioned adhesives include a methanol-benzene mixture, a methanol (or ethanol)-toluene mixture, and chloroform.

In order to promote the adhesion, the mold to be used in the injection molding needs to be kept at a definite, relatively high temperature. Such a temperature is at least 100° C., preferably from 110° to 160° C. It is possible thereby to mold a substrate with copper foil circuit which adhere firmly to a surface of the substrate.

Preheating the mold at the above defined temperature permits softening or melting the adhesive itself, whereby not only its compatibility with the melt-injected resin can be bettered but also the surface of the melt-injected resin substrate can be maintained above a definite temperature and hence in the state of being compatible with the adhesive. Moreover, the substrate resin in this state is pressurized by the injection pressure, whereby the adherence of the adhesive to the copper foil and to the substrate resin is bettered. While electrolytic copper foils for common printed circuits are generally used herein, copper foils produced by sputtering can also be used. The thickness of copper foils is generally from 5 to 35 μm.

The term "copper foil" used in this specification means either one forming circuits already or one that will form circuits.

The production of printed circuit boards according to the present invention by injection molding is outlined below.

Polycarbonate, polyethersulfone, or polyetherimide, as stated above, is chosen as a substrate resin depending on the applications of the end product.

A copper foil is laid through a suitable tackifier over a carrier film the opposite side of which is treated with a mold release agent. In this case, the coarsened side of the copper foil is brought to become the outer face (this side is not in contact with the carrier film but is coated with an adhesive stated above). The copper foil is sticked on the carrier film to such a slight degree as to be readily separated from the film when a peeling force is exerted on the copper foil. However, the sticking force needs to withstand through the etching process of the copper foil.

Carrier films for this purpose include polyester films and polyimide films.

The copper foil on the thermal transfer film thus prepared is coated with a definite amount of solvent solution of a suitable resin, and after drying the coat, the foil-film assembly is introduced in a mold for injection molding.

The molding is better carried out by using, for example, an apparatus having such a mechanism as to repeat the following cycle operation:

(1) A part of the mold is opened to such an extent that the foil-film assembly can be introduced, (2) the mold is closed, (3) a substrate resin is injected to shape a substrate and simultaneously transfer circuits onto the substrate, (4) the whole shaped assembly is withdrawn from the mold and only the carrier film is removed by winding it on a drum, and then (5) the next cyclic operation is begun.

The present invention is illustrated with reference to the following examples which are not intended to restrict the scope of the invention.

EXAMPLES AND COMPARATIVE EXAMPLES

As shown in Table 1, four kinds of high-temperature thermoplastic resins (examples of the invention) and seven other kinds of resins (comparative examples) were used as substrate resins.

TABLE 1

| | Kind of resin used | Trade name of resin used (maker) |
|---|---|---|
| Example of present invention | Polyethersulfone (PES) | Victrex 4101G GL-20, 20% glass fiber reinforced (Mitsui-Toatsu Chemicals, Inc.) |
| | Polyethersulfone (PES) | Victrex 4100G (unfilled) (Mitsui-Toatsu Chemicals, Inc.) |
| | Polyetherimide (PEI) | ULTEM #2200, 20% glass fiber reinforced (Engineering Plastics Co., Ltd.) |
| | Polycarbonate (PC) | Panlite GN-3130, 30% glass fiber reinforced (Teijin Chemical Ltd.) |
| Comparative Example | Polyetheretherketone (PEEK) | Victrex 380G (Mitsui-Toatsu Chemicals, Inc.) |
| | Polyphenylene sulfide (PPS) | Tolerina A-504, 40% glass fiber reinforced (Toray Industries, Inc.) |
| | ABS | GR-2000 (Denki Kagaku Co., Ltd.) |
| | Nylon 6 | Amilan CM-1021 (Toray Industries, Inc.) |
| | Modified PPO | Noryl 731J (Polyplastics Co., Ltd.) |
| | Liquid-crystalline polyester | Vectra A950 (Polyplastics Co., Ltd.) |
| | PBT | PBT 1401 |

TABLE 1-continued

| Kind of resin used | Trade name of resin used (maker) |
|---|---|
| | (Toray Industries, Inc.) |

Resins listed above were injection-molded under conditions shown in table 2.

TABLE 2

| Resin | Cylinder temperature (°C.) | Injection pressure (mg/cm²) |
|---|---|---|
| PES | 340–380 | 1000 |
| PEI | 350–390 | 1000 |
| PC | 280–310 | 1000 |
| PEEK | 350–390 | 1000 |
| PPS | 300–340 | 1000 |
| ABS | 200–210 | 800 |
| Nylon 6 | 240–260 | 800 |
| Modified PPO | 280–320 | 800 |
| Liquid-crystalline polyester | 270–310 | 700 |
| PBT | 230–260 | 800 |

Copper foils 35 μm thick (supplied by Nippon Denkai Co., Ltd.) were used with their coarsened sides coated with adhesives. The used adhesives were polyvinyl formal and polyvinyl butyral of varying degrees of polymerization shown in Table 3.

TABLE 3

| Kind of resin | Tradename of resin (maker) | Average degree of polymerization |
|---|---|---|
| Polyvinyl formal | Denka Formal #200 (Denki Kagaku Co., Ltd.) | ca. 950 |
| Polyvinyl butyral | Denka Butyral 2000L (above company) | ca. 300 |
| Polyvinyl butyral | Denka Butyral 3000K (above company) | ca. 700 |
| Polyvinyl butyral | Denka Butyral 5000A (above company) | ca. 2000 |

All of these adhesives, dissolved in chloroform, were applied severally on copper foils, and dried at 150° C. for 30 minutes. Each copper foil-film assembly was introduced in a mold to attack the film to one side wall of the mold cavity, the mold was closed, and a substrate resin was injection-molded. The mold used in these examples and comparative examples had a cavity to provide a plate-shaped molding at each shot, thus preparing moldings each having a copper foil adhering to one side thereof. Thus prepared specimens were tested for the adhesive strength of the copper foil to the substrate. In this test for the adhesive strength, the peel strength was measured in accordance with JIS C6481. Results of the measurement together with molding conditions are summarized in Tables 4–9.

TABLE 4

Example 1

| Ex. No | Substrate resin | Adhesive Type | Amount applied (g/m²) | Mold temp. (°C.) | Peel strength (Kg/cm) |
|---|---|---|---|---|---|
| 1 | PES (glass fiber reinforced) | Formal #200 | 15 | 120 | 0.24 |
| 2 | PES (glass fiber reinforced) | " | 20 | " | 0.43 |
| 3 | PES (glass fiber reinforced) | " | 25 | " | 0.53 |
| 4 | PES (glass fiber reinforced) | " | 30 | " | 0.78 |
| 5 | PES (glass fiber reinforced) | " | 36 | " | 1.36 |
| 6 | PES (glass fiber reinforced) | " | 45 | " | 1.28 |
| 7 | PES (glass fiber reinforced) | " | 60 | " | 1.25 |
| 8 | PES (glass fiber reinforced) | " | 63 | " | 1.28 |
| 9 | PES (glass fiber reinforced) | " | 30 | 65 | 0.04 |
| 10 | PES (glass fiber reinforced) | " | " | 80 | 0.20 |
| 11 | PES (glass fiber reinforced) | " | " | 100 | 0.50 |
| 12 | PES (glass fiber reinforced) | " | " | 120 | 0.85 |
| 13 | PES (glass fiber reinforced) | " | " | 150 | 1.18 |
| 14 | PES (unfilled) | Butyral 2000L | " | " | 1.30 |
| 15 | PES (unfilled) | Butyral 3000K | " | " | 1.20 |
| 16 | PES (unfilled) | Butyral 5000A | " | " | 0.30 |

TABLE 5

Example 2

| Ex. No | Substrate resin | Adhesive Type | Amount applied (g/m²) | Mold temp. (°C.) | Peel strength (Kg/cm) |
|---|---|---|---|---|---|
| 1 | PEI (glass fiber reinforced) | Formal #200 | 12 | 120 | 0.04 |
| 2 | PEI (glass fiber reinforced) | " | 20 | " | 0.74 |
| 3 | PEI (glass fiber reinforced) | " | 30 | " | 0.74 |
| 4 | PEI (glass fiber reinforced) | " | 36 | " | 1.45 |
| 5 | PEI (glass fiber reinforced) | " | 42 | " | 1.52 |
| 6 | PEI (glass fiber reinforced) | " | 54 | " | 1.58 |
| 7 | PEI (glass fiber reinforced) | " | 30 | 80 | 0.14 |
| 8 | PEI (glass fiber reinforced) | " | " | 100 | 0.53 |
| 9 | PEI (glass fiber reinforced) | " | " | 120 | 0.88 |
| 10 | PEI (glass fiber reinforced) | " | " | 150 | 1.40 |

TABLE 6

Example 3

| Ex. No | Substrate resin | Adhesive Type | Amount applied (g/m²) | Mold temp. (°C.) | Peel strength (Kg/cm) |
|---|---|---|---|---|---|
| 1 | PC (glass fiber reinforced) | Formal #200 | 9 | 120 | 0 |
| 2 | PC (glass fiber reinforced) | " | 15 | " | 0.12 |
| 3 | PC (glass fiber reinforced) | " | 20 | " | 0.58 |
| 4 | PC (glass fiber reinforced) | " | 30 | " | 1.42 |
| 5 | PC (glass fiber reinforced) | " | 36 | " | 1.30 |
| 6 | PC (glass fiber reinforced) | " | 48 | " | 1.28 |
| 7 | PC (glass fiber reinforced) | " | 63 | " | 1.34 |
| 8 | PC (glass fiber reinforced) | " | 66 | " | 1.34 |
| 9 | PC (glass fiber reinforced) | " | 39 | 50 | 0.17 |
| 10 | PC (glass fiber reinforced) | " | " | 80 | 0.36 |
| 11 | PC (glass fiber reinforced) | " | " | 100 | 0.10 |
| 12 | PC (glass fiber reinforced) | " | " | 120 | 1.38 |
| 13 | PC (glass fiber reinforced) | " | " | 130 | 1.23 |

TABLE 7

Comparative Example 1

| Ex. No | Substrate resin | Adhesive Type | Amount applied (g/m²) | Mold temp. (°C.) | Peel strength (Kg/cm) |
|---|---|---|---|---|---|
| 1 | PEEK (unfilled) | Formal #200 | 12 | 120 | 0.05 |
| 2 | PEEK (unfilled) | " | 18 | " | 0.13 |
| 3 | PEEK (unfilled) | " | 30 | " | 0.10 |
| 4 | PEEK (unfilled) | " | 39 | " | 0.18 |
| 5 | PEEK (unfilled) | " | 45 | " | 0.32 |
| 6 | PEEK (unfilled) | " | 30 | 50 | 0.02 |
| 7 | PEEK (unfilled) | " | " | 80 | 0.01 |
| 8 | PEEK (unfilled) | " | " | 100 | 0.07 |
| 9 | PEEK (unfilled) | " | " | 120 | 0.12 |
| 10 | PEEK (unfilled) | " | " | 150 | 0.48 |

TABLE 8

| Ex. No | Substrate resin | Comparative Example 2 Adhesive Type | Amount applied (g/m²) | Mold temp. (°C.) | Peel strength (Kg/cm) |
|---|---|---|---|---|---|
| 1 | PPS (glass fiber reinforced) | Formal #200 | 12 | 120 | 0.02 |
| 2 | PPS (glass fiber reinforced) | " | 20 | " | 0.04 |
| 3 | PPS (glass fiber reinforced) | " | 30 | " | 0.08 |
| 4 | PPS (glass fiber reinforced) | " | 36 | " | 0.18 |
| 5 | PPS (glass fiber reinforced) | " | 42 | " | 0.17 |
| 6 | PPS (glass fiber reinforced) | " | 48 | " | 0.29 |
| 7 | PPS (glass fiber reinforced) | " | 54 | " | 0.25 |
| 8 | PPS (glass fiber reinforced) | " | 30 | 50 | 0.01 |
| 9 | PPS (glass fiber reinforced) | " | " | 80 | 0.07 |
| 10 | PPS (glass fiber reinforced) | " | " | 100 | 0.05 |
| 11 | PPS (glass fiber reinforced) | " | " | 120 | 0.05 |
| 12 | PPS (glass fiber | " | " | 150 | 0.34 |

TABLE 9

| Ex. No | Substrate resin | Comparative Example 3 Adhesive Type | Amount applied (g/m²) | Mold temp. (°C.) | Peel strength (Kg/cm) |
|---|---|---|---|---|---|
| 1 | ABS (unfilled) | Formal #200 | 30 | 120 | 0.1 or less |
| 2 | Nylon 6 (unfilled) | " | " | " | 0.1 or less |
| 3 | Modified PPO (unfilled) | " | " | " | 0.1 or less |
| 4 | Liquid-crystalline polyester (unfilled) | " | " | " | 0.1 or less |
| 5 | PBT (unfilled) | " | " | " | 0.3 |

When the adhesive strength between the substrate and the copper foil is 0.4 to 0.5 Kg/cm in terms of the peel strength, such printed circuit boards may be used depending on the applications thereof, but at least an adhesive strength of 1 Kg/cm is required for general-purpose printed circuit boards.

As can be seen from Tables 4–9, printed circuit boards satisfying the adhesive strength requirements were obtained by injection molding under the following conditions: Three substrate resins polyethersulfone, polyetherimide, and polycarbonate were used each, polyvinyl formal and polyvinyl butyral having degrees of polymerization of 1000 and less were applied each in an amount of at least 20 g/m², preferably 30 to 60 g/m², and the mold was preheated at a temperature of at least 100° C., preferably about 110° to 160° C.

When the amount of adhesive applied exceeds 60 g/m², the adhesive remains as an appreciable layer between the copper foil and the substrate and hence tends to cause troubles in the after treatment of the molded board. When the mold preheating temperature exceeds 160° C., the moldings tend to be impaired in shape when ejected from the mold since the temperature is close to secondary transition point of the substrate resin if said temperature exceeds 160° C.

While the moldings in these examples are in a plate shape, copper foil circuits can also be stuck on inner walls of three-dimensional hollow moldings such as box-shaped moldings at the same time that the moldings are formed.

According to the present invention, it has become possible that copper foils, which are reliable as materials for printed circuits, are sticked on substrates simultaneously with forming these substrates from resins excellent in heat resistance by injection molding, thus producing moldings with circuits attached thereto at the same time that the moldings are formed. Sticking of copper foils on moldings of special shapes has also become possible. That is, various moldings provided with the function of printed circuit boards have become producible in short operation periods and in large quantities. The present inventive technique is expected to develop as a new application area in the printed circuit board industry.

What is claimed is:

1. An injection-molded resin article which comprises:
   (1) an injection-molded thermoplastic resin comprising at least one thermoplastic resin selected from the group consisting of a polycarbonate, a polyethersulfone and a polyetherimide, and said injection-molded thermoplastic resin having a molded shape;
   (2) a copper foil; and
   (3) an adhesive layer composed of the one selected from the group consisting of polyvinyl butyral having a degree of polymerization of up to 1000, a polyvinyl formal having a degree of polymerization of up to 1000 and a mixture of said polyvinyl butyral and said polyvinyl formal; said layer being disposed between said injection-molded thermoplastic resin and said copper foil in an amount of at least 20 g/m².

2. The injection-molded thermoplastic resin article of claim 1, wherein the thermoplastic resin contains a filler.

3. The injection-molded article of claim 1, wherein said adhesive layer is formed at the same time of the injection-molding of the article.

4. The injection-molded article of claim 1, wherein said copper foil is a copper foil circuit.

5. The injection-molded thermoplastic resin article of claim 1, wherein the amount of the adhesive layer disposed is 30 to 60 g/m².

* * * * *